(12) United States Patent
Pretl

(10) Patent No.: US 7,847,642 B2
(45) Date of Patent: Dec. 7, 2010

(54) FREQUENCY TUNING CIRCUIT, USE OF THE TUNING CIRCUIT AND METHOD FOR FREQUENCY TUNING

(75) Inventor: Harald Pretl, Schwertberg (AT)

(73) Assignee: Infineon Technologies AG, Munich (DE)

(*) Notice: Subject to any disclaimer, the term of this patent is extended or adjusted under 35 U.S.C. 154(b) by 94 days.

(21) Appl. No.: 11/641,330

(22) Filed: Dec. 19, 2006

(65) Prior Publication Data

US 2007/0222527 A1    Sep. 27, 2007

(30) Foreign Application Priority Data

Dec. 20, 2005    (DE) .................. 10 2005 060 944

(51) Int. Cl.
*H03L 7/091* (2006.01)
*H03L 7/093* (2006.01)

(52) U.S. Cl. .................. 331/36 C; 331/179; 341/143

(58) Field of Classification Search ............... 331/36 C, 331/179; 341/143
See application file for complete search history.

(56) References Cited

U.S. PATENT DOCUMENTS

| | | | |
|---|---|---|---|
| 5,036,294 A * | 7/1991 | McCaslin | 331/1 A |
| 5,898,345 A * | 4/1999 | Namura et al. | 331/177 V |
| 6,172,576 B1 | 1/2001 | Endo et al. | |
| 6,304,152 B1 * | 10/2001 | Takahashi et al. | 331/116 FE |
| 6,400,231 B1 | 6/2002 | Leduc et al. | |
| 6,606,004 B2 | 8/2003 | Staszewski et al. | |
| 6,791,422 B2 * | 9/2004 | Staszewski et al. | 331/36 C |
| 7,271,673 B2 * | 9/2007 | Song | 331/167 |

OTHER PUBLICATIONS

"A First Digitally-Controlled Oscillator in a Deep-Submicron CMOS Process for Multi-GHz Wireless Applications", Robert B. Staszewski, Dirk Leipold, Chih-Ming Hung and Poras T. Balsara, IEEE Radio Frequency Integrated Circuits Symposium, 2003, pp. 81-84.

"A Crystal Oscillator with Automatic Amplitude Control and Digitally Controlled Pulling Range of ±100PPM", Vishnu Balan and Tzuwang Pan, IEEE Circuits and Systems, 2002, ISCAS 2002, International Symposium, vol. 5, pp. 461-464.

"A 800 μA, 105 $MH_z$ CMOS Crystal-Oscillator Digitally Trimmable to 0.3 PPM", Qiuting Huang and Philipp Basedau, ASIC Conference and Exhibit, 1996, Proceedings, Ninth Annual IEEE International, vol. Iss. 23-27, Sep. 1996, pp. 283-286.

* cited by examiner

*Primary Examiner*—Robert Pascal
*Assistant Examiner*—James E Goodley
(74) *Attorney, Agent, or Firm*—Eschweiler & Associates, LLC

(57) ABSTRACT

A frequency tuning circuit includes a connection for coupling to a signal tap of an element which has a resonant frequency. The tuning circuit contains a controllable-capacitance capacitance array for tuning of a signal frequency of the element. The capacitance array has a multiplicity of capacitances which can be connected to a control connection via a signal. In this case, the capacitance array is coupled to the connection. A control input is used to supply a digital control word. Furthermore, the tuning circuit contains a sigma-delta modulator whose input side is coupled to the control input and whose output side is coupled to the control connection of the capacitance array. This makes it possible to produce a tuning word by means of which the effective resolution of the capacitance array can be increased.

13 Claims, 3 Drawing Sheets

FREQUENCY TUNING CIRCUIT, USE OF THE TUNING CIRCUIT AND METHOD FOR FREQUENCY TUNING

REFERENCE TO RELATED APPLICATIONS

This application claims the benefit of the priority date of German application DE 10 2005 060 944.9, filed on Dec. 20, 2005, the contents of which are herein incorporated by reference in their entirety.

FIELD OF THE INVENTION

The invention relates to a tuning circuit for frequency tuning, in particular for a reference oscillator, and to the use of a tuning circuit such as this in a transmitting or receiving device. The invention also relates to a method for frequency tuning.

BACKGROUND OF THE INVENTION

Modern communication appliances require a very precise time base for signal processing of data to be transmitted. A so-called reference oscillator, which emits a signal at a stable frequency, is frequently used for this time base. A crystal oscillator is in turn used as the base for the reference oscillator, and has one specific resonant frequency with a high Q-factor. All of the clock signals which are required for operation of the communication appliance are derived from a signal from the reference oscillator. For example, the communication appliance uses the reference signal to tune the frequency of a transmission signal to a desired carrier frequency for the transmission of data. An accurate time base is also desirable for digital signal processing, for example for production of digital data at an intended data rate.

The continual trend toward larger-scale monolithic integration of individual components on a semiconductor body is leading to the development of tunable crystal oscillators, and thus to tunable reference oscillators. The tuning of the output frequency of a signal which is derived from the crystal oscillator makes it possible to subsequently correct aging effects and temperature effects. For example, this means that it is possible to vary the output frequency of a crystal oscillator for example by means of a variable capacitance, with the aid of an analog setting voltage. Another option is to provide a plurality of switchable capacitances and to use them to directly influence the output frequency from the crystal oscillator. An implementation such as this is also referred to as a digitally tunable crystal oscillator (DCXO).

Since, in general, only a very minor frequency change need be made to the resonant frequency of the crystal oscillator, it is necessary to provide a large number of capacitors with very small capacitances. This is necessary in order to sufficiently increase the resolution when changing the output frequency of the crystal oscillator. A signal at an accurate frequency can be maintained only by sufficiently good resolution. The large number of individual capacitors with small capacitances leads to a particularly large chip area, and thus to greater costs.

It would be desirable to achieve an adequate resolution accuracy even with a smaller chip area, in particular for adjustment of a reference oscillator.

BRIEF DESCRIPTION OF THE DRAWINGS

Various aspects and embodiments of the present invention are combined in the following description.

In the figures.

DETAILED DESCRIPTION OF THE INVENTION

Figure 1:
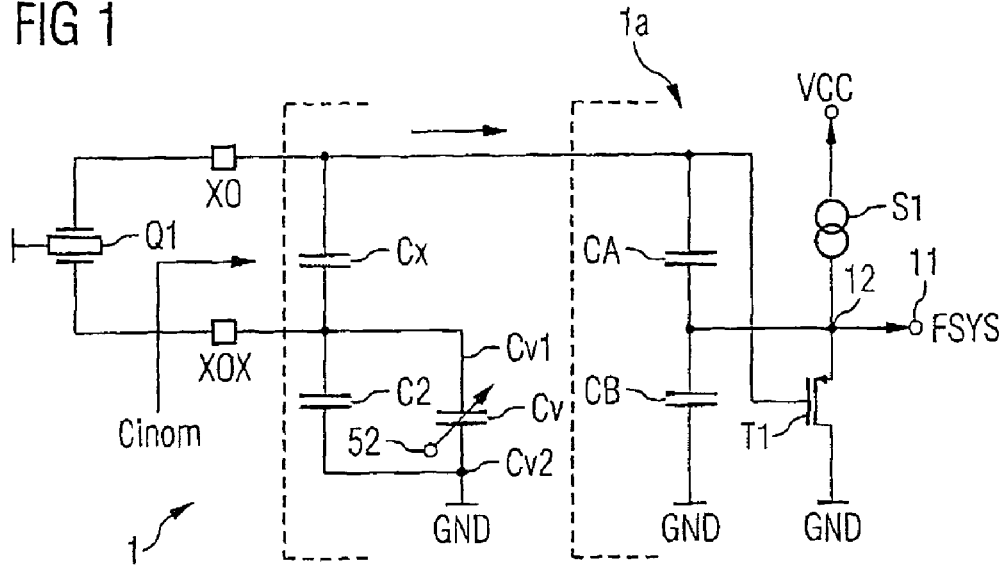
FIG. 1 shows an exemplary embodiment of a crystal oscillator which can be tuned to discrete values.

Reference is made below to the accompanying figures, which form a part of the description and in which illustrations are used to show how the invention can be implemented in practice. The embodiments in the drawings represent one or more examples, in order to allow better understanding of one or more aspects of the present invention. This description of the embodiments of the invention is not intended to restrict the features or individual elements of the invention to a specific embodiment. In fact, the various elements, aspects and features which are disclosed in the exemplary embodiments can be combined in various ways by a person skilled in the art in order to achieve one or more advantages of the invention. It should be understood that other embodiments could be used, and that structural or logical changes could be made without departing from the fundamental idea of the present invention. The elements in the drawings are not necessarily shown true to scale with respect to one another. The same reference symbols denote similar parts which correspond to one another.

It is proposed that the number of capacitors or switchable capacitive components in an arrangement whose capacitance can be controlled be reduced. Normally, this also means a reduction in the resolution or coarser frequency changing during tuning. In order nevertheless to achieve the desired resolution for accurate tuning, it is proposed that a digital control word that is used for tuning be oversampled. The total capacitance of the arrangement for tuning of the oscillator is then set by means of the tuning word obtained by the oversampling process. By way of example, a sigma-delta modulator is suitable for oversampling such as this, and is referred to for short as a $\Sigma\Delta$ modulator.

One embodiment of the invention makes it possible to achieve higher effective resolution, thus making it possible to reduce the number of capacitances within the arrangement. This therefore results in higher resolution and thus more precise frequency adjustment than would be possible by direct processing of the digital tuning word.

Since a component having a highly selective resonant frequency is also provided, quantization noise is filtered by the proposed signal processing of the digital tuning signal by the crystal oscillator. The phase noise of the crystal oscillator is not influenced by this.

In one embodiment of the invention, one output of a tuning circuit is connected to an oscillator core. Together with the component whose resonant frequency is tunable, this thus results in a reference oscillator which emits a signal at a highly stable frequency. The oscillator core may, for example, be formed by a Colpitt's oscillator, a Pierce oscillator or else a Butler oscillator. Further clock signals can be derived from the reference signal that is emitted from the oscillator core.

For example, it is possible to use the reference signal to produce a clock signal which is used for operation of the modulator for the tuning circuit, and which is used for carrying out oversampling.

Another embodiment of the invention relates to the implementation of the arrangement, and an implementation of the capacitive components that are provided within the arrangement. A reduction in the number and the proposed signal processing together with oversampling reduce the requirements for the processing accuracy during the production of the individual capacitive components. This can be achieved using the invention in one embodiment by periodically connecting a number of individual capacitive components by means of the oversampled tuning word. This results in averaging of the capacitance of the individual components.

In a further embodiment of the invention, the digital control word to be processed comprises a first control word element of a first partial length, as well as a second control word element of a second partial length. A sigma-delta modulator is configured to supply the second control word element. On the output side, it emits a word that has been derived from the second control word element to an adder, which has a second input in order to supply the first control word element. The adder uses this to form the digital tuning word.

In another embodiment of the invention, the capacitive components of the controllable-capacitance arrangement comprise capacitors, for example, metal-isolator-metal capacitors.

In order to comply with the increasing integration density, the tuning circuit in one embodiment of the invention comprises a monolithically integrated circuit in a semiconductor body. Contact points can be provided on one surface of the semiconductor body and form a connection for coupling to a signal tap on a crystal oscillator. The crystal oscillator can thus be provided externally to the semiconductor body.

A digital control word is produced using the invention in one embodiment in order to tune a crystal oscillator. This digital control word is used to select controllable capacitive components in an arrangement for tuning of a signal frequency of a crystal oscillator. Provision is made for the digital control word to be subdivided into a first control word element and a second control word element. The second control word element is then oversampled, and the result of the oversampling is added to the first control word element. This results in the tuning word, which is used to control the capacitance of the arrangement.

In other words, a mean value is formed from the second control word element. A capacitance array for tuning of an output frequency of the oscillator is driven with the aid of the sum of the first control word element and the result obtained by the averaging of the second control word element. The oversampling and continuous switching of the individual capacitive components in the capacitance array make it possible to achieve considerably higher capacitive resolution for the arrangement than would be possible by the switching of individual capacitances.

FIG. 1 shows one exemplary embodiment which implements aspects of the invention. This shows a digitally tunable reference oscillator 1 in a semiconductor body with a crystal Q1 connected. This is illustrated together with various semiconductor components in a semiconductor body. The individual elements form an integrated circuit, for example for signal processing, which requires a stable-frequency reference signal during operation. The oscillator 1 is provided for this purpose. One output 11 is used to provide a clock signal Fsys, which predetermines the time base for all of the other components which are provided in the semiconductor body.

In other words, all of the other clock signals which are required for signal processing are produced from the clock signal that is produced at the output 11. These include, for example, frequency division of the clock signal Fsys that is produced, or else frequency multiplication.

The tuning circuit described here also has two partial connections XO, XOX. The crystal Q1 is connected as an external element to these partial connections XO, XOX. The two partial connections are used to supply a push-pull signal, which is emitted from the crystal, to a Colpitt's oscillator 1a, in order to produce the clock signal Fsys. For this purpose, the circuit also contains a capacitor Cx, which is connected between the two partial connections XO and XOX.

Furthermore, in one embodiment the partial connection XO is connected to a control connection of a transistor T1. This transistor T1 is connected between a ground potential connection as well as a current source S1 and a supply potential connection. A node 12 is provided between the transistor T1 (which is in the form of a p-channel field-effect transistor) and the current source S1, and is connected to the tap 11 for the clock signal Fsys. The node 12 is likewise connected to two capacitors CA and CB. A second connection of the capacitor CB is likewise connected to the reference ground potential GND. The capacitor CA is connected by its second connection to the control connection of the transistor T1.

The arrangement comprising the transistor T1 and the two capacitors CA, CB and the current source S1 forms an oscillator core of the reference oscillator. The capacitor Cx, the quartz crystal Q1 as well as the capacitors C2 and the variable-capacitance charge storage device Cv are used in order to tune the frequency of this reference oscillator, by tuning of the resonant frequency of the crystal oscillator. In this case, the elements C2 and Cv are arranged in parallel, with one of their connections connected to the reference-ground potential, and their other connection connected to the partial connection XOX.

The controllable-capacitance charge storage device Cv in this case represents a controllable capacitance array and has a control input 52 for supplying a tuning word Ni. The total capacitance of the capacitance array Cv can be adjusted with the aid of the tuning word.

Figure 4:
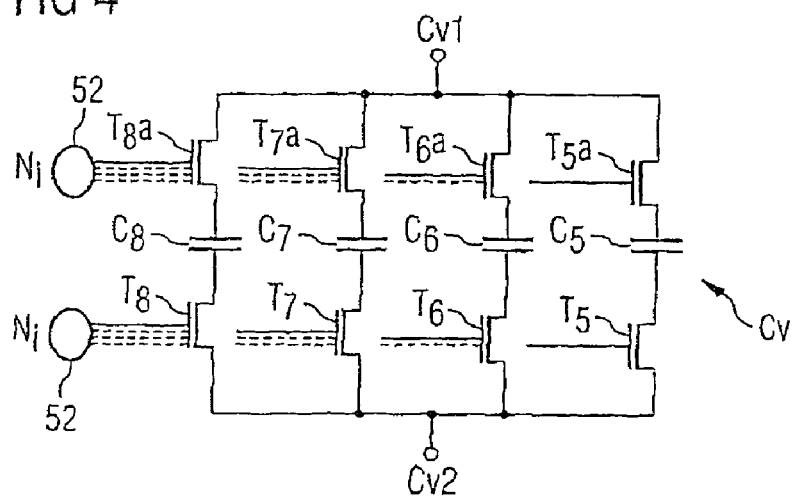
FIG. 4 shows an exemplary embodiment of a capacitance array with switchable capacitances.

FIG. 4 shows one exemplary embodiment of a capacitance array that may be employed in the controllable capacitance array in FIG. 1, in this case illustrating four individual capacitors $C_5$ to $C_8$, which are in the form of so-called metal-isolator-metal capacitors (MIMCap). In detail, they are arranged in parallel with one another and are connected between in each case two field-effect transistors, $T_5$, $T_{5a}$ to $T_8$, $T_{8a}$. The field-effect transistors are used for connection and disconnection of the respective capacitor $C_5$ to $C_8$ to the capacitance array. They thus act as switches. The connection and disconnection of the individual capacitors varies the total capacitance of the capacitance array Cv in discrete-value steps. All of the control connections of the individual transistors $T_5$, $T_{5a}$ to $T_8$, $T_{8a}$ form the control input 52 for this purpose.

In order to achieve very good resolution and high frequency-adjustment accuracy, in one embodiment it is advantageous to provide a large number of capacitors in the capacitance array Cv. In order furthermore to obtain a tuning circuit with a uniform tuning characteristic, the process fluctuations during the production of the illustrated capacitance array in one embodiment should be small. Larger process fluctuations and/or differences in the effective capacitance values of the individual capacitors can lead to the capacitance array having a non-uniform tuning response.

In order to improve the tuning response, in one embodiment it is proposed that the individual capacitances no longer be driven directly by a digital tuning word at the control input 52.

Figure 2:
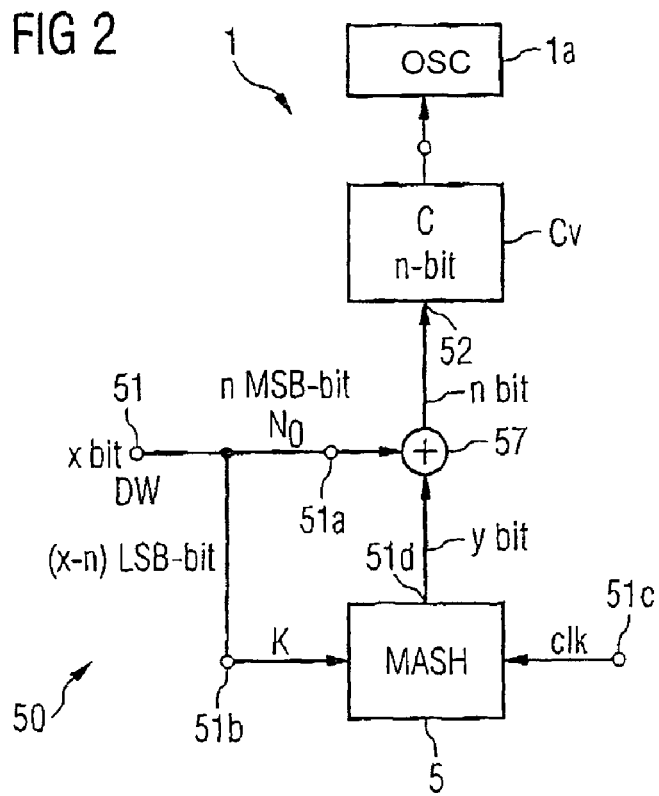
FIG. 2 shows an exemplary embodiment of a tuning circuit according to the invention.

In fact, the resolution and thus the tuning response as well can be improved by suitable measures for signal processing of the word that is supplied. FIG. 2 shows a refinement of the tuning circuit according to one embodiment of the invention with the aid of a sigma-delta modulator. In this case, a digital control word DW for adjustment of the capacitance array with the aid of sigma-delta modulation is subjected to an oversampling process. This oversampling makes it possible to increase the effective resolution of a digital tuning word Ni that is supplied to the capacitance array Cv.

The tuning circuit 50 according to one embodiment of the invention as illustrated in FIG. 2 has a control input 51 for supplying a digital control word DW with a word length of x bits. The digital control word is subdivided into two control word elements $N_0$ and K. The first control word element $N_0$ comprises a total of n bits of the control word DW, which represent the "most significant bits" (MSB). The other (x−n) bits represent the "least significant bits" (LSB) and form the second control word element K, which is supplied to an input 51b of a sigma-delta modulator 5, which is referred to for short as a $\Sigma\Delta$ modulator. The sigma-delta modulator oversamples the second control word element K with the aid of a clock signal CLK which is supplied at its clock input 51c. The clock signal CLK can in fact be derived from a reference signal, which is produced in one embodiment at the output 11 of the reference oscillator as shown in FIG. 1.

Noise shaping of the supplied control word element K and averaging are thus carried out. The output 51d of the sigma-delta modulator 5 is connected to one input of an adder 57. The first control word element $N_0$ is supplied to a second input 51a of the adder 57.

The adder 57 forms the sum of the digital words supplied to it. A tuning word Ni with a word length of n bits is emitted at the output of the adder 57, with the word length of n bits now being shorter than the original word length of the control word DW. The output is connected to the control connection 52 of the capacitance array Cv.

The reduction in the resolution of the word that is supplied to the capacitance array reduces the number of switchable capacitors required for the capacitance array. This allows the capacitance array Cv to be integrated with considerably reduced space occupancy in a semiconductor body. At the same time, a capacitance array with a considerably greater effective resolution is achieved by the oversampling by the modulator 5 and the continuous switching between the various individual capacitance values, on the basis of the second control word element. The efficient resolution thus corresponds essentially to the word length of the digital control word DW that is supplied.

In one embodiment of the invention, the aid of a sigma-delta modulator results in high resolution and a precise frequency selection accuracy even with a capacitance array Cv which has a lower nominal resolution of only n bits.

If, for example, the data word DW has a word length x of x=17 bits, this resolution can also be achieved for a capacitance array with a resolution n of n=14 bits. The improvement results from a sigma-delta modulator to which the last three bits of the data word DW are supplied as the control word element. If, for example, the sigma-delta modulator 5 is in the form of a mash 1-1-1 modulator and has an accumulator length of sixteen bits, this results in a data word with a length of y=3 bits being emitted at its output 51c. This is added to the control word element $N_0$ and results in a tuning word which leads to an effective resolution of x=17 bits within the capacitance array Cv.

Figure 5:
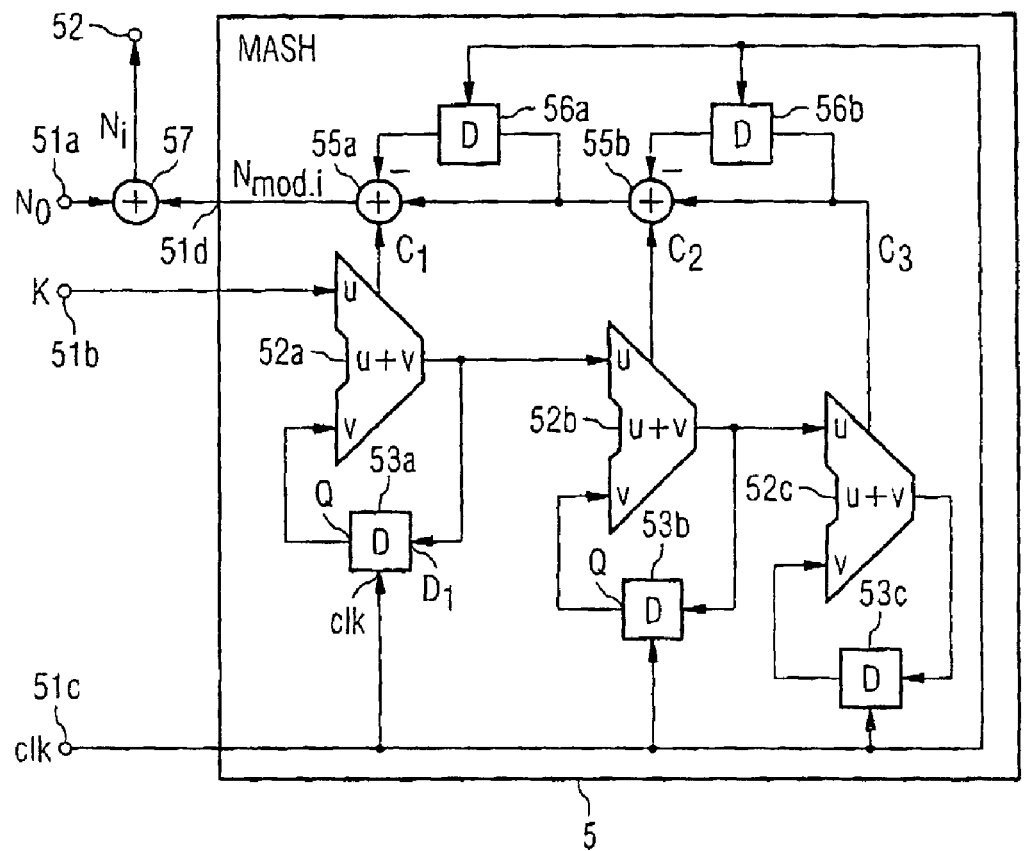
FIG. 5 shows an exemplary embodiment of a sigma-delta modulator.

FIG. 5 shows one exemplary embodiment of a cascaded sigma-delta modulator 5 as can be used for noise shaping and for oversampling of the control word DW. The $\Sigma\Delta$ modulator 5 in one embodiment comprises a third-order mash modulator (multistage noise shaping modulator). It contains three series-connected modulator stages. A clock input 51c is used to supply a clock signal CLK to the individual modulator stages of the modulator 5. Furthermore, the modulator has an input element 51b for supplying the second control word element K. The input element 51b is connected to a first modulator stage of the mash modulator 5. In one embodiment, the input element 51b is connected to a first accumulator 52. One output of the accumulator 52 is in turn coupled to a first input of a second modulator 52b. Its output is connected to the third modulator stage of the mash modulator 5, in detail to an input u of the third modulator stage 52c.

The output u+v of the first accumulator 52a is furthermore fed back via a delay element 53a to a second input v of the first accumulator 52a. This delay element 53a is formed by a flipflop in one embodiment. In this case, the data input $D_1$ of the flipflop is used to supply the output signal from the first accumulator 52a. One data output Q of the flipflop forms the output of the delay element 53a.

In one embodiment, feedback in an identical form is also provided in a corresponding manner in the second modulator stage for the second accumulator 52b and in the third modulator stage for the third accumulator 52c. The accumulators 52a to 52c for the individual modulator stages of the mash modulator 5 each have an overflow output. This is connected to in each case one input of an adder 55a or 55b. The adders 55a, 55b form a part of a feedback path. In detail, the overflow signal $c_2$ from the second accumulator 52b together with the overflow signal $c_3$ from the third accumulator 52c are combined in the adder 55b. Furthermore, one output of a further delay element 56b is connected to a third input of the adder 55b. The input side of this delay element 56b is connected to the overflow output of the third accumulator 52c, and is used to supply the inverted overflow signal $c_3$ to the adder 55b.

The output of the adder 55b is connected to one input of the first adder 55a. The overflow signal $c_1$ from the adder 52a is likewise supplied to this first adder 55a. A delay element 56a is also provided in a corresponding manner here, is connected on the input side to the output of the adder 55b, and is connected on the output side to the adder 55a. The result $N_{mod, i}$ from the adder 55a is emitted at the output 51c, and is added to the first control word element $N_0$ in the adder 57. The overall result forms the tuning word for the capacitance array Cv.

Figure 3:
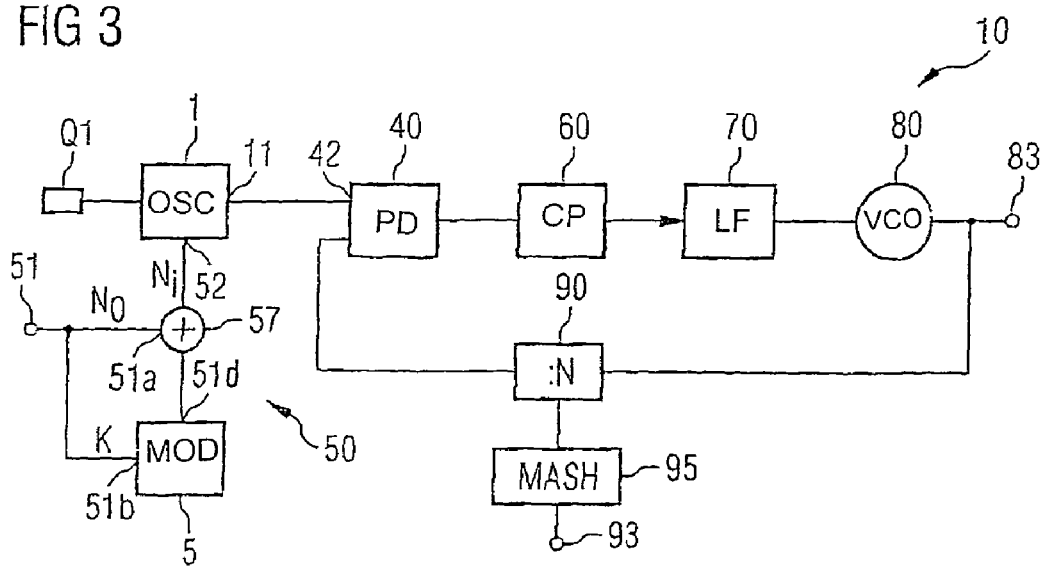
FIG. 3 shows a phase locked loop with a tuning circuit.

FIG. 3 shows a phase locked loop with the tuning circuit according to one embodiment of the invention for a crystal oscillator that is connected to it in order to produce a reference signal at a reference frequency. The phase locked loop contains a phase detector (PD) 40, a charge pump (CP) 60 connected to it on the output side, and a loop filter (LF) 70. The output side of the loop filter 70 is connected to a control input of a voltage controlled oscillator (VCO) 80. The control loop also has a variable division-ratio frequency divider 90 in its feedback path. The division ratio of the frequency divider 90 is selected via a control word which is emitted from a mash modulator 95. The mash modulator 95 produces this control word from a frequency word which is applied to its input 93.

In order to accurately adjust an output signal from the voltage controlled oscillator 80 in the phase locked loop, it is necessary to supply the phase detector 40 with a reference signal at a stable frequency. This is produced by a reference oscillator with the tuning circuit according to the invention. For this purpose, the output 11 of an oscillator apparatus (OSC) 1 with a crystal oscillator Q1 connected thereto is connected to the reference signal input 42 of the phase detector 40. The circuit 1 comprises a controllable capacitance array, which is not illustrated but whose control input 52 has the tuning word $N_t$ supplied to it. This is produced from the sum of a first adjustment word element $N_0$ and a signal which is emitted from a modulator (MOD) 5. For this purpose, the control input 52 is connected to the output of an adder 57. A first input 51a of the adder 57 is coupled to the input 51 in order to supply a first adjustment word element N00. A second input of the adder 57 is connected to an output 51c of the modulator 5.

Figure 6:
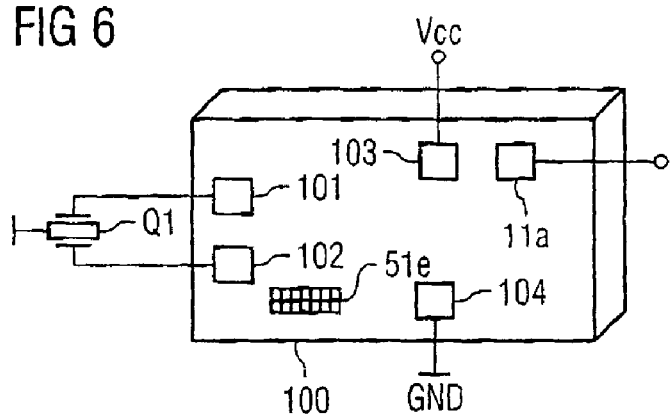
FIG. 6 shows an illustration of a semiconductor body with contact points arranged on the surface.

The increasing integration and configuration of transmitters and receivers as integrated circuits in semiconductor bodies make it appear to be expedient to configure the reference oscillator and the tuning circuit as an integrated circuit in the semiconductor body. FIG. 6 shows a semiconductor body 100 such as this.

A plurality of contact elements on the surface of the semiconductor body 100 are used to supply various supply and control signals. In detail, the semiconductor body 100 has the contact points 103 and 104 on its surface. These are connected to a supply potential connection VCC and to a reference ground potential connection GND to form a voltage supply for the electronic components which are located within the semiconductor body. On its surface, the semiconductor body also has a multiplicity of contact elements 51e, to which the digital control word DW is applied in order to adjust the capacitance array. This exemplary embodiment in this case provides for the individual bits of the control word to be supplied in parallel to the contact pads. However, it is likewise possible for the control word DW to be applied as a serial digital signal, and for this to be processed by means of a serial/parallel converter within the semiconductor body 100.

Two further contact points 101, 102 respectively form partial connections X, XO. The crystal Q1 is connected to the contact points 101, 102. This allows the tuning circuit according to the invention to be formed in a semiconductor body, while the crystal is still provided as an external component. This refinement allows a crystal to be replaced, or crystals with different resonant frequencies to be provided. Other oscillator circuits can also be used rather than the embodiment described here of the tuning circuit with a Colpitt's oscillator. For example, the oscillator arrangement 1a illustrated in FIG. 1 can be replaced by a Pierce oscillator or a Butler oscillator.

It is likewise possible for the capacitance array to have different capacitors. For example, these can be designed both for coarse capacitance selection and for fine capacitance selection. In the exemplary embodiment described in the present case, the capacitance array has a binary weighting on the basis of the control word that is supplied. A thermometer code can alternatively be used for adjustment of the capacitance array. However, one advantageous factor is that the resolution of the capacitance array thus makes it possible to reduce the number of capacitors that have to be used, without this resulting in a reduction in the effective resolution. This is possible by oversampling of a digital control word which is used to adjust the capacitance array. In particular, sigma-delta modulation methods or modulation methods which operate on a similar principle are suitable for this purpose.

Although specific embodiments have been illustrated and described herein, it will be appreciated by those of ordinary skill in the art, that any arrangement which is calculated to achieve the same purpose may be substituted for the specific embodiments shown. It is to be understood, that the above description is intended to be illustrative and not restrictive. This application is intended to cover any adaptations or variations of the invention. Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

It is emphasized that the Abstract is provided to comply with 37 C.F.R. section 1.72(b) requiring an abstract that will allow the reader to quickly ascertain the nature and gist of the technical disclosure. It is submitted with the understanding, that it will not be used to interpret or limit the scope or meaning of the claims.

The invention claimed is:

1. A frequency tuning circuit, comprising:
a first connecting terminal and a second connecting terminal configured to connect therebetween to a reference element having a single resonant frequency;
a controllable-capacitance arrangement configured to tune the resonant frequency of the reference element, the arrangement comprising one control terminal configured to receive a tuning word as a control signal and a plurality of charge storage devices selectively connected to the control terminal via the tuning word, wherein the controllable-capacitance arrangement is connected to and arranged between the second connecting terminal that is connected to the reference element and a ground terminal;
a control input configured to receive a digital control word;
a sigma-delta modulator coupled to the control input and comprising an output coupled to the control terminal of the controllable-capacitance arrangement; and
an adder, configured to:
add a first control word element, received at a first input thereof connected to the control input, to an adjusted control word element, received at a second input thereof connected to the output of the sigma-delta modulator; and
output a tuning word, based on the first control word element and the adjusted control word element, at an output connected to the control terminal of the controllable-capacitance arrangement,
wherein the sigma-delta modulator is configured to oversample a second control word element to produce the adjusted control word element,
wherein the digital control word comprises the first control word element of a first partial length and the second control word element of a second partial length, and wherein an input of the sigma-delta modulator is coupled to the control input and receives the second control word element, and
wherein the number of switchable charge storage devices in the arrangement is a one-to-one correspondence to the first partial length of the first control word element.

2. The frequency tuning circuit of claim 1, wherein the sigma-delta modulator comprises a mash modulator.

3. The frequency tuning circuit of claim 1, further comprising an oscillator distinct from the reference element, connected to the first connecting terminal of the reference element, wherein the oscillator comprises a Colpitt's oscillator.

4. The frequency tuning circuit of claim 1, wherein the tuning circuit comprises a monolithically integrated circuit in a semiconductor body.

5. The frequency tuning circuit of claim 4, further comprising contact points provided on one surface of the semiconductor body, the contact points forming a connection to the reference element.

6. The frequency tuning circuit of claim 1, wherein the reference element comprises one of the following elements:
- a quartz crystal;
- a crystal oscillator;
- a bandpass filter; and
- a surface acoustic wave filter.

7. The frequency tuning circuit of claim 1, wherein at least one of the charge storage devices comprises a metal-isolator-metal capacitor.

8. A frequency tuning circuit, comprising:
- a variable capacitance circuit configured to vary a capacitance thereof in discrete increments, and comprising a resonant frequency input that receives a single resonant frequency from a reference element having a single resonant frequency and a plurality of capacitance elements selectively coupled thereto based on a state of a tuning word received at a control input thereof, wherein the variable capacitance circuit is connected to and arranged between the reference element and a ground terminal;
- a control circuit configured to receive a digital control word and generate the tuning word based on a first portion of the digital control word and a processed second portion of the digital control word;
- a modulator circuit configured to oversample the second portion of the digital control word to generate the processed second portion; and
- an adder circuit configured to add the first portion of the digital control word and the processed second portion of the digital control word to generate the tuning word,
- wherein the first portion comprises a first number of bits, and the second portion comprises a second number of remaining bits, and wherein the tuning word output from the adder circuit comprises the first number of bits, and wherein a number of the plurality of capacitances is a one-to-one correspondence to the first number of bits.

9. The frequency tuning circuit of claim 8, wherein the control circuit is configured to divide the digital control word into the first portion having a first number of bits, and the second portion having a second number of remaining bits, and wherein the control circuit is further configured to oversample the second portion comprising the second number of bits, thereby performing a noise shaping and averaging operation thereon.

10. The frequency tuning circuit of claim 9, wherein the control circuit is further configured to add the first portion to the processed second portion to form the tuning word, wherein the tuning word comprises the first number of bits.

11. The frequency tuning circuit of claim 8, wherein the modulator circuit is configured to perform an oversampling of the second portion of the digital control word, thereby performing a noise shaping and averaging operation thereon.

12. The frequency tuning circuit of claim 1, wherein the reference element is an external component to the frequency tuning circuit which is integrated on a semiconductor body.

13. The frequency tuning circuit of claim 1, wherein the first connecting terminal of the reference element is further connected to an oscillator that is distinct from the reference element.

* * * * *